(12) United States Patent
Akiyama et al.

(10) Patent No.: US 7,315,209 B2
(45) Date of Patent: Jan. 1, 2008

(54) POWER AMPLIFIER APPARATUS AND DC COMPONENT REMOVING METHOD

(75) Inventors: Takuro Akiyama, Kanagawa (JP); Toshihiko Masuda, Tokyo (JP)

(73) Assignee: Sony Corporation, Tokyo (JP)

( * ) Notice: Subject to any disclaimer, the term of this patent is extended or adjusted under 35 U.S.C. 154(b) by 216 days.

(21) Appl. No.: 11/185,799

(22) Filed: Jul. 21, 2005

(65) Prior Publication Data

US 2006/0022752 A1 Feb. 2, 2006

(30) Foreign Application Priority Data

Jul. 30, 2004 (JP) ............................ 2004-223462

(51) Int. Cl.
*H03F 3/217* (2006.01)
(52) U.S. Cl. .................... 330/251; 330/207 A
(58) Field of Classification Search .................. 330/10, 330/207 A, 251
See application file for complete search history.

(56) References Cited

U.S. PATENT DOCUMENTS 6,172,628 B1 1/2001 Sculley et al. .............. 341/120
6,671,329 B1 12/2003 Lenz .......................... 375/297
7,209,002 B2 * 4/2007 Ohkuri et al. ................ 330/10

FOREIGN PATENT DOCUMENTS

WO WO 2004/057757 A1 7/2004

OTHER PUBLICATIONS

Patent Abstracts of Japan, JP 2004-072707, Mar. 4, 2004.

* cited by examiner

*Primary Examiner*—Khanh Van Nguyen
(74) *Attorney, Agent, or Firm*—Oblon, Spivak, McClelland, Maier & Neustadt, P.C.

(57) ABSTRACT

A power amplifier apparatus includes a dither superimposing unit superimposing DC dither on a digital signal; a switching signal generating unit converting the digital signal on which the DC dither is superimposed by the dither superimposing unit to a pair of drive pulses on high and low sides having opposite levels; and a cancel signal generating unit generating a cancel signal to cancel a DC component caused by the DC dither by changing a ratio of pulse widths of the drive pulses on the high and low sides generated by the switching signal generating unit.

6 Claims, 11 Drawing Sheets

(A) OUT1+

(B) HO (C) OUT1−

(D) LO

POWER AMPLIFIER APPARATUS AND DC COMPONENT REMOVING METHOD

CROSS REFERENCES TO RELATED APPLICATIONS

The present invention contains subject matter related to Japanese Patent Application JP 2004-223462 filed in the Japanese Patent Office on Jul. 30, 2004, the entire contents of which are incorporated herein by reference.

BACKGROUND OF THE INVENTION

1. Field of the Invention

The present invention relates to a power amplifier called a D-class amplifier (referred to as a "power amplifier apparatus" in this specification).

2. Description of the Related Art

A digital amplifier called a D-class amplifier has been known as an audio power amplifier apparatus. The D-class amplifier amplifies power by switching, which is configured in the manner shown in FIG. 11, for example.

Referring to FIG. 11, a digital audio signal Pin is supplied to a PWM (pulse width modulation) circuit 11 through an input terminal Tin and a clock signal having a predetermined frequency is supplied from a clock generating unit 12 to the PWM circuit 11, so that the digital audio signal Pin is converted to a pair of PWM signals PA and PB.

In this case, as shown in FIG. 13, pulse widths of the PWM signals PA and PB vary in accordance with a level of the digital audio signal Pin (instantaneous level at the time when the signal Pin is D/A converted (this is the same in the following description)). The pulse width of the PWM signal PA corresponds to the level of the digital audio signal Pin, whereas the pulse width of the PWM signal PB corresponds to a two's-complement number of the level of the digital audio signal Pin.

In the example shown in FIG. 13, rising edges of the PWM signals PA and PB are fixed to a start point of a cycle TC of the PWM signals PA and PB, and falling edges thereof change in accordance with the level of the digital audio signal Pin.

Further, a carrier frequency fc (=1/TC) of the PWM signals PA and PB is 16 times a sampling frequency fs of the digital audio signal Pin, as shown in "F" in FIG. 12. If fs=48 kHz, fc=16fs=16×48 kHz=768 kHz is satisfied.

The PWM signal PA from the PWM signal 11 is supplied to a drive circuit 13. Then, as shown in "A" in FIG. 12, a pair of driving pulse voltages (drive pulses) +PA and −PA, the former having the same level as the signal PA and the latter having an inverted level, are generated. These pulse voltages +PA and −PA are supplied to gates of a pair of switching devices, e.g., n-channel MOS-FETs (metal oxide semiconductor type field effect transistors) Q11 and Q12, respectively.

In this case, the FETs Q11 and Q12 form a push-pull circuit 15. A drain of the FET Q11 connects to a power supply terminal TPWR, a source thereof connects to a drain of the FET Q12, and a source of the FET Q12 connects to a ground. A stable DC (direct current) voltage +VDD is supplied as a power supply voltage to the power supply terminal TPWR. The voltage +VDD is 20 to 50 V, for example.

The source of the FET Q11 and the drain of the FET Q12 connect to one terminal of a speaker 19 through a low-pass filter 17 including a coil and a capacitor.

Also, the PWM signal PB is supplied from the PWM circuit 11 in the same manner as in the PWM signal PA. That is, the PWM signal PB is supplied to a drive circuit 14. Then, as shown in "B" in FIG. 12, a pair of driving pulse voltages (drive pulses) +PB and −PB, the former having the same level as the signal PB and the latter having an inverted level, are generated. These pulse voltages +PB and −PB are supplied to gates of a pair of n-channel MOS-FETs Q13 and Q14 forming a push-pull circuit 16, respectively.

A source of the FET Q13 and a drain of the FET Q14 connect to the other terminal of the speaker 19 through a low-pass filter 18 including a coil and a capacitor.

With this configuration, when +PA="H" (high), −PA="L" (low), the FET Q11 is turned ON, and the FET Q12 is turned OFF. Therefore, a voltage VA at a node between the FETs Q11 and Q12 is equal to the voltage +VDD, as shown in "C" in FIG. 12. On the other hand, when +PA="L", −PA="H", the FET Q11 is turned OFF, and the FET Q12 is turned ON. Therefore, the voltage VA is 0 (zero).

Likewise, when +PB="H", −PB="L", the FET Q13 is turned ON, and the FET Q14 is turned OFF. Therefore, a voltage VB at a node between the FETs Q13 and Q14 is equal to the voltage +VDD, as shown in "D" in FIG. 12. On the other hand, when +PB="L", −PB="H", the FET Q13 is turned OFF, and the FET Q14 is turned ON. Therefore, the voltage VB is 0 (zero).

During a period when VA=+VDD and VB=0, a current i flows from the node between the FETs Q11 and Q12 through the low-pass filter 17, the speaker 19, and the low-pass filter 18, to the node between the FETs Q13 and Q14, as shown in FIG. 11 and "E" in FIG. 12.

On the other hand, during a period when VA=0 and VB=+VDD, the current i flows in the opposite direction from the node between the FETs Q13 and Q14 through the low-pass filter 18, the speaker 19, and the low-pass filter 17, to the node between the FETs Q11 and Q12. However, the current i does not flow during periods when VA=VB=+VDD and when VA=VB=0. That is, the push-pull circuits 15 and 16 form a BTL (bridge tied load) circuit.

A period when the current i flows changes in accordance with a period when the PWM signals PA and PB are risen. Further, when the current i flows through the speaker 19, the current i is integrated by the low-pass filters 17 and 18. As a result, the current i flowing through the speaker 19 is an analog current corresponding to the level of the digital audio signal Pin and is a power-amplified current. In other words, power-amplified output is supplied to the speaker 19.

As described above, the circuit shown in FIG. 11 functions as a power amplifier apparatus. At this time, the FETs Q11 to Q14 amplify power by switching the power supply voltage +VDD in accordance with the input digital audio signal Pin. Therefore, a large output can be obtained with high efficiency.

Such a power amplifier apparatus is disclosed in Patent Documents 1 and 2 (Japanese Unexamined Patent Application Publication Nos. 2004-072707 and 2004-023216). In these Patent Documents, efforts are made to save power and enhance the performance.

SUMMARY OF THE INVENTION

In a so-called hi-fi audio field, a delta-sigma (δ·σ) modulation method in which an accuracy of 16 bits or more can be obtained by using an A/D (analog/digital) converter or D/A (digital/analog) converter of 1-bit accuracy is used for A/D conversion or D/A conversion of an audio signal. In the delta-sigma modulation method, signal processing of adding DC (direct current) dither is typically used in order to prevent idling noise (beat) caused when inputting microsignals. However, when the DC dither is used, a DC component is superimposed on an audio signal.

In the above-described power amplifier apparatus called a D-class amplifier, the delta-sigma modulation may be used and DC dither may be used for an audio signal. In that case, however, a DC component caused by the DC dither may appear in output of a speaker. The DC component appearing in output of the speaker may cause so-called POP noise and even breakdown of the power amplifier apparatus, which is disadvantageous.

In order to remove such a DC component, a method of providing a coupling capacitor in a signal line is traditionally used. However, if this method is used in output of the power amplifier apparatus, POP noise may occur and sound quality may be degraded. Further, in a high-power amplifier, a capacitor allowing a large ripple current should be used. This can provoke problems of heat-up and deterioration in distortion factor of the capacitor.

Further, a DC component caused by DC dither is superimposed on an audio signal. Therefore, even when an output stage of the power amplifier apparatus is configured by using a BTL (bridge tied load) connection (full-bridge configuration), the DC component is likely to appear in output of a speaker if a coupling capacitor is not used.

In view of the above-described problems, the present invention provides a power amplifier apparatus called a D-class amplifier capable of removing a DC component caused by DC dither without using a coupling capacitor and a DC component removing method used in the power amplifier apparatus.

According to an embodiment of the present invention, there is provided a power amplifier apparatus including a dither superimposing unit superimposing DC dither on a digital signal; a switching signal generating unit converting the digital signal on which the DC dither is superimposed by the dither superimposing unit to a pair of drive pulses on high and low sides having opposite levels; and a cancel signal generating unit generating a cancel signal to cancel a DC component caused by the DC dither by changing a ratio of pulse widths of the drive pulses on the high and low sides generated by the switching signal generating unit.

With this configuration, the power amplifier apparatus is a so-called D-class amplifier including the dither superimposing unit, the switching signal generating unit, and the cancel signal generating unit. By changing the ratio of the pulse widths of the drive pulses on the high and low sides generated by the switching signal generating unit by using the cancel signal generating unit, the DC component caused by the DC dither is canceled.

Accordingly, the DC component caused by the DC dither superimposed on an input signal can be canceled, so-called POP noise can be prevented, and breakdown of the power amplifier apparatus due to the DC dither superimposed on the input signal can be prevented.

In the power amplifier apparatus, the cancel signal generating unit may include a delay unit delaying at least one of the drive pulses on the high and low sides by a predetermined amount, and may change the ratio of the pulse widths of the drive pulses by performing a logical operation of a delayed drive pulse generated by the delay unit and the drive pulse which is not delayed.

With this configuration, in the cancel signal generating unit, the delay unit delays at least one of the drive pulses on the high and low sides by a predetermined amount and a logical operation of a delayed drive pulse and the drive pulse which is not delayed is performed, so that the ratio of the pulse widths of the drive pulses is changed.

In this way, the pulse width of at least one of the drive pulses on the high and low sides is adjusted in accordance with the DC component caused by superimposing DC dither on an input signal. Accordingly, a DC component as a cancel component having an opposite polarity to that of the DC component caused by the DC dither is generated, so that the DC component caused by the DC dither superimposed on the input signal can be accurately and reliably removed. As a result, so-called POP noise can be prevented and breakdown of the power amplifier apparatus due to the DC dither superimposed on the input signal can also be prevented.

In the power amplifier apparatus, the cancel signal generating unit may include a threshold adjusting unit adjusting a threshold for switching the drive pulses on the high and low sides generated by the switching signal generating unit, and may change the ratio of the pulse widths of the drive pulses by using the threshold adjusting unit.

With this configuration, the cancel signal generating unit adjusts the threshold for switching the drive pulses on the high and low sides generated by the switching signal generating unit, so that the ratio of the pulse widths of the drive pulses can be changed.

In this way, the pulse width of at least one of the drive pulses on the high and low sides is adjusted in accordance with the DC component caused by superimposing DC dither on an input signal. Accordingly, a DC component as a cancel component having an opposite polarity to that of the DC component caused by the DC dither is generated, so that the DC component caused by the DC dither superimposed on the input signal can be reliably removed. As a result, so-called POP noise can be prevented and breakdown of the power amplifier apparatus due to the DC dither superimposed on the input signal can also be prevented.

In the power amplifier apparatus called a D-class amplifier, a DC component caused by DC dither appearing in output of a speaker can be reduced to almost zero. In particular, a high-power amplifier can obtain a significant effect because the amount of superimposed DC component is larger as the power supply voltage of a power switching device is higher. Furthermore, an output coupling capacitor is not required in this configuration, which enhances sound quality and eliminates factors of POP noise and breakdown of the speaker.

DESCRIPTION OF THE PREFERRED EMBODIMENTS

Hereinafter, an apparatus and a method according to an embodiment of the present invention are described with reference to the drawings. In the following description, the apparatus and method according to the embodiment of the present invention are applied to a non-feedback digital D-class amplifier (power amplifier apparatus).

Figure 1:
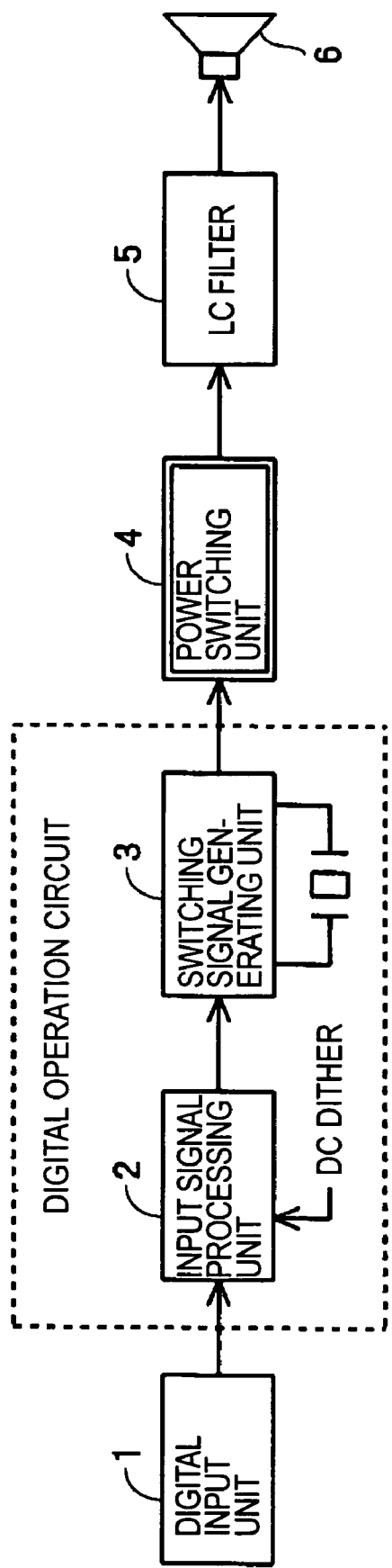
FIG. 1 is a block diagram illustrating a non-feedback D-class amplifier to which an apparatus and method according to an embodiment of the present invention is applied.
Figure 12:
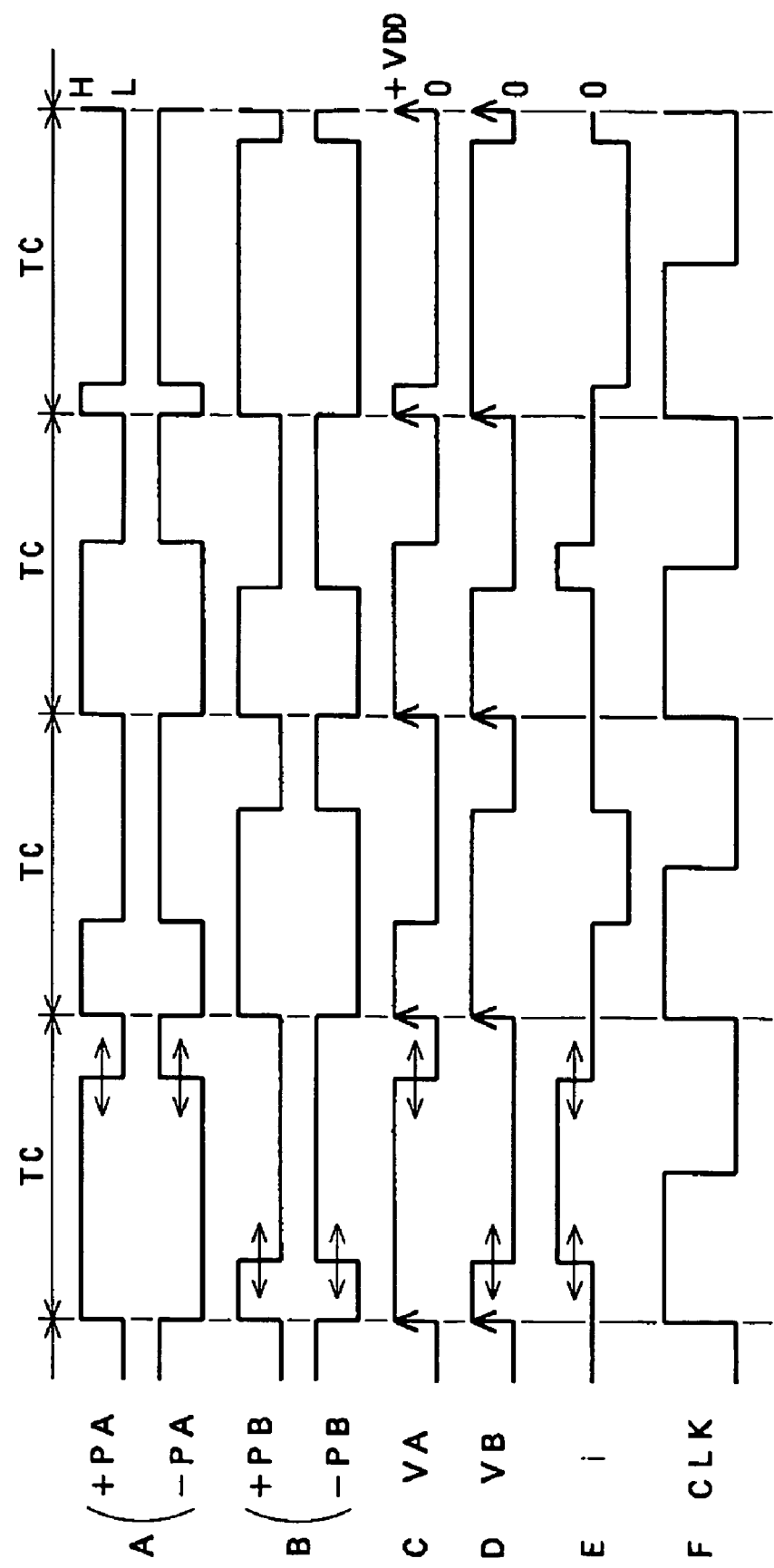
FIG. 12 illustrates the known D-class amplifier.
Figure 13:
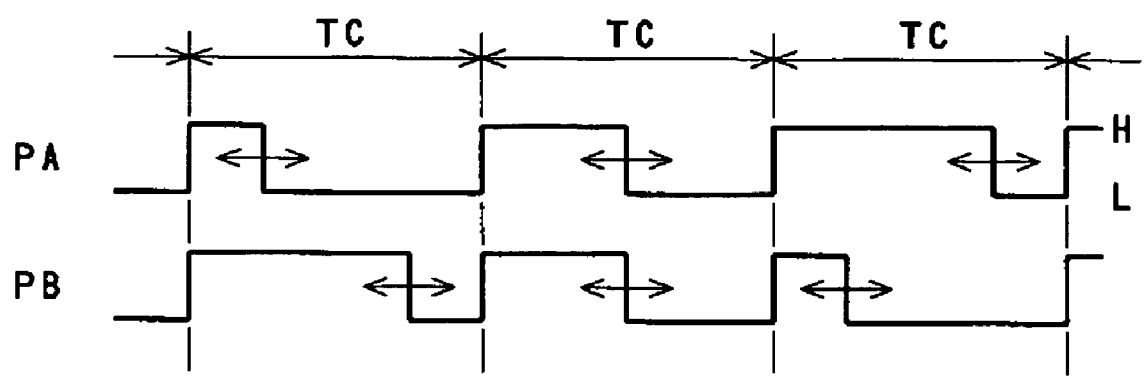
FIG. 13 illustrates the known D-class amplifier.

FIG. 1 is a block diagram illustrating an example of a configuration of a non-feedback D-class amplifier. Hereinafter, an overview of the configuration and operation of the non-feedback D-class amplifier shown in FIG. 1 is described. A basic function of the non-feedback D-class amplifier shown in FIG. 1 is the same as that of the known D-class amplifier described with reference to FIGS. 11 to 13.

As shown in FIG. 1, the non-feedback digital D-class amplifier includes a digital input unit 1, an input signal processing unit 2, a switching signal generating unit 3, a power switching unit 4, and an LC filter 5.

Digital audio signals input through the digital input unit 1 are supplied to the input signal processing unit 2. Each of the supplied digital audio signals has been converted to a digital signal by delta-sigma modulation. The input signal processing unit 2 processes the supplied digital audio signal by superimposing DC dither thereon in order to prevent idling noise of microsignals, and supplies the processed digital audio signal to the switching signal generating unit 3.

The switching signal generating unit 3 performs pulse width modulation (PWM) on the digital audio signal from the input signal processing unit 2 so as to generate a pair of PWM signals OUT1 and OUT2 and to generate driving pulse voltages (drive pulses) based on the pair of PWM signals, and supplies the drive pulses to the power switching unit 4.

In this case, pulse widths of the pair of PWM signals OUT1 and OUT2 generated in the switching signal generating unit 3 vary in accordance with a level of the digital audio signal. The pulse width of the PWM signal OUT1 corresponds to the level of the digital audio signal and the pulse width of the PWM signal OUT 2 corresponds to a two's-complement number of the level of the digital audio signal.

Then, the switching signal generating unit 3 generates a pair of drive pulses of non-inverted and inverted signals based on the respective PWM signals OUT1 and OUT2 and supplies the drive pulses to the power switching unit 4. More specifically, a non-inverted signal OUT1+ and an inverted signal OUT1− are generated based on the PWM signal OUT1, and a non-inverted signal OUT2+ and an inverted signal OUT2− are generated based on the PWM signal OUT2. These drive pulse signals OUT1+, OUT1−, OUT2+, and OUT2− are supplied to the power switching unit 4.

The power switching unit 4 has a push-pull circuit configuration including switching devices. The power switching unit 4 amplifies power by switching a power supply voltage to the digital audio signal and supplies the power-amplified current to a speaker 6 through the LC filter 5 functioning as a low-pass filter.

Accordingly, an analog current corresponding to the level of the digital audio signal, that is, a power-amplified current is supplied to the speaker 6, so that sound corresponding to an input analog audio signal can be output from the speaker 6.

As described above, in the non-feedback digital D-class amplifier shown in FIG. 1, DC dither is added in the input signal processing unit 2 just after the digital input unit 1. Therefore, in the non-feedback D-class amplifier according to this embodiment, a DC component caused by the DC dither added in the input signal processing unit 2 is removed in the power switching unit 4.

Figure 2:
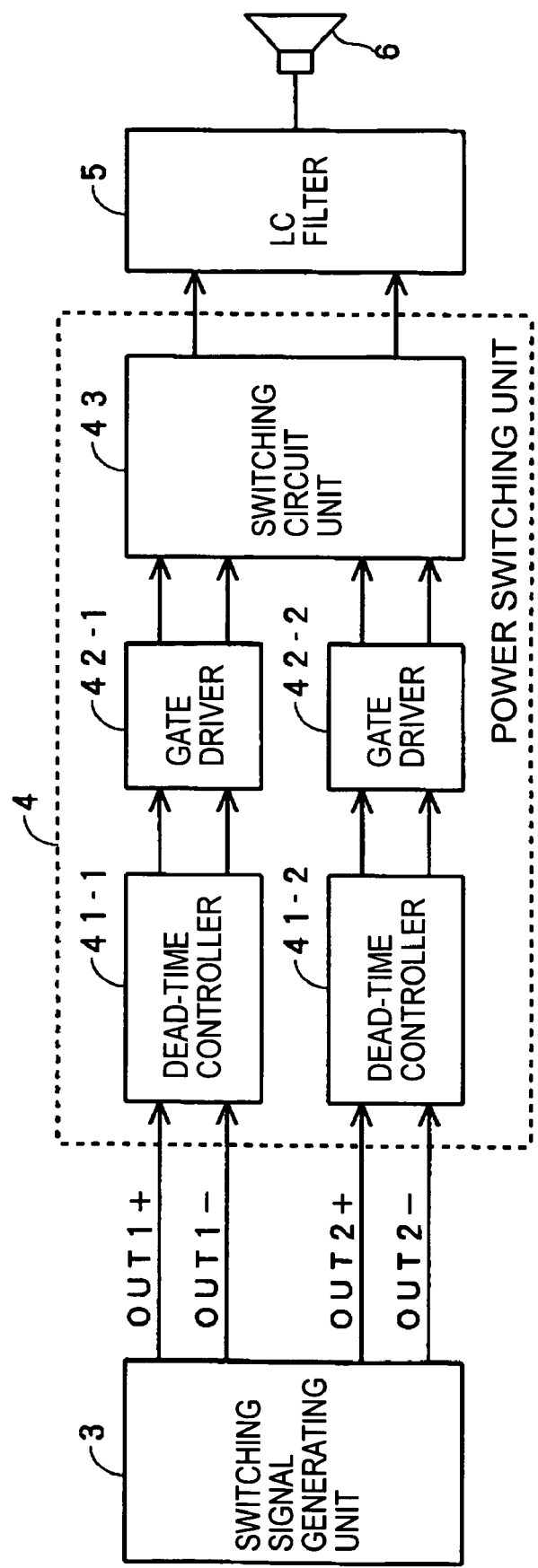
FIG. 2 is a block diagram illustrating a power switching unit 4 shown in FIG. 1.

FIG. 2 is a block diagram illustrating the power switching unit 4 of the non-feedback D-class amplifier according to this embodiment. In order to clearly show connections with the previous and subsequent stages, the switching signal generating unit 3 before the power switching unit 4 and the LC filter 5 and the speaker 6 after the power switching unit 4 are also shown.

As described above, the drive pulses OUT1+, OUT1−, OUT2+, and OUT2− generated based on the pair of PWM signals OUT1 and OUT2 are supplied to the power switching unit 4.

As shown in FIG. 2, the power switching unit 4 includes dead-time controllers 41-1 and 41-2, gate drivers 42-1 and 42-2, and a switching circuit unit 43. The dead-time controllers 41-1 and 41-2, which will be described later, control time when switching devices on high and low sides of the switching circuit unit 43 are turned OFF at the same time. The gate drivers 42-1 and 42-2 generate drive pulse signals to be supplied to the switching devices. The switching circuit unit 43 amplifies a current to be supplied to the speaker 6 by switching operations.

Figure 3:
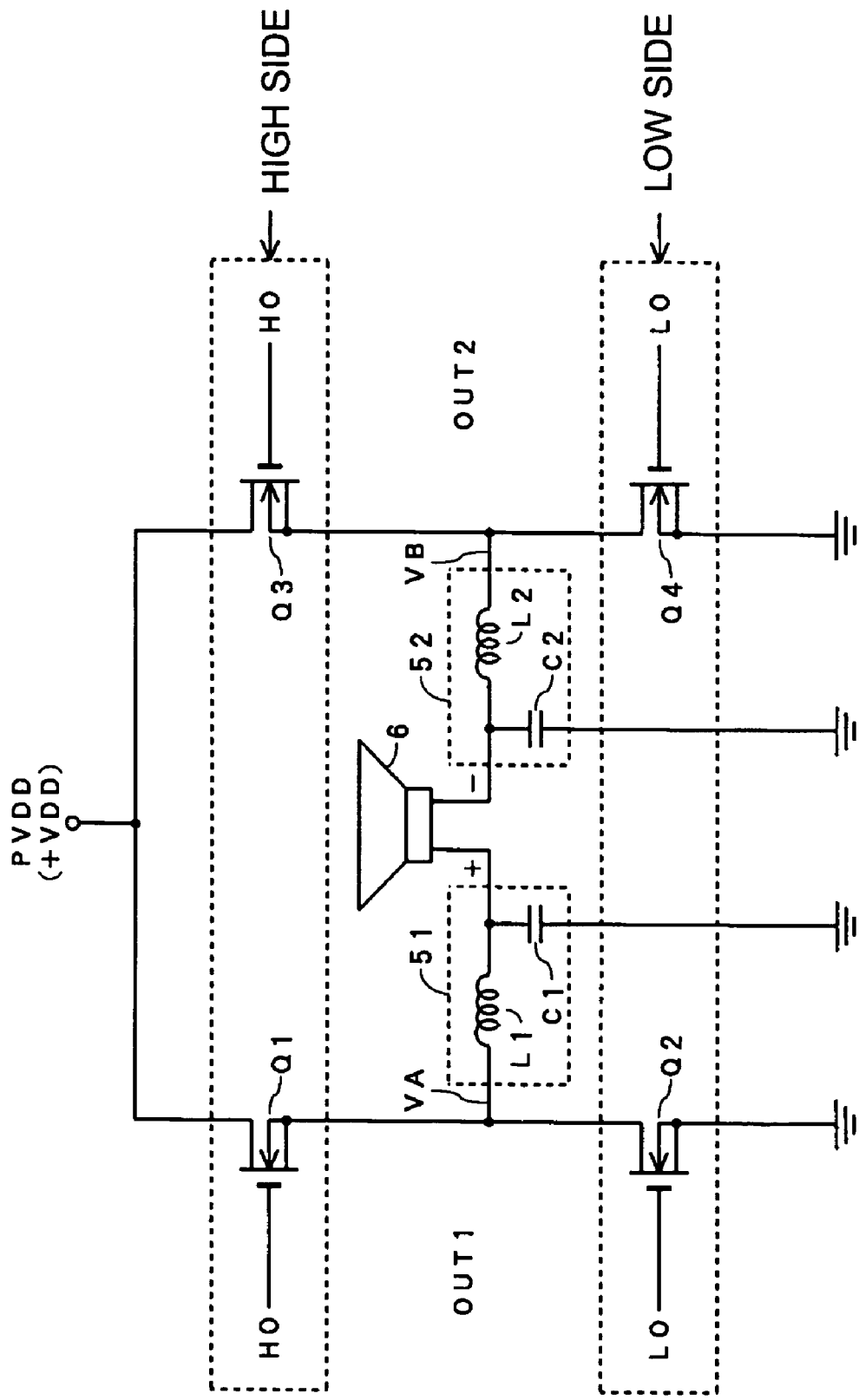
FIG. 3 illustrates a switching circuit unit 43 of the power switching unit 4 shown in FIG. 2.

First, a configuration of the switching circuit unit 43 is described. FIG. 3 illustrates the switching circuit unit 43 of the power switching unit 4 shown in FIG. 2. In FIG. 3, LC filters 51 and 52 forming the LC filter 5 are also shown.

As shown in FIG. 3, the switching circuit unit 43 of the non-feedback D-class amplifier according to this embodiment includes n-channel MOS-FETs Q1 and Q2 forming a push-pull circuit and n-channel MOS-FETs Q3 and Q4 forming another push-pull circuit.

A drain of the FET Q1 connects to a power supply terminal PVDD, a source thereof connects to a drain of the FET Q2, and a source of the FET Q2 connects to a ground. Likewise, a drain of the FET Q3 connects to the power supply terminal PVDD, a source thereof connects to a drain of the FET Q4, and a source of the FET Q4 connects to the ground. A stable DC voltage +VDD is supplied as a power supply voltage to the power supply terminal PVDD.

The source of the FET Q1 and the drain of the FET Q2 connect to one terminal of the speaker 6 through the LC filter 51 including a coil L1 and a capacitor C1, and the source of the FET Q3 and the drain of the FET Q4 connect to the other terminal of the speaker 6 through the LC filter 52 including a coil L2 and a capacitor C2.

With this configuration, the drive pulse OUT1+ as a non-inverted signal of the PWM signal OUT1 is supplied to the gate of the FET Q1, and the drive pulse OUT1− as an inverted signal of the PWM signal OUT1 is supplied to the gate of the FET Q2. Likewise, the drive pulse OUT2+ as a non-inverted signal of the PWM signal OUT2 is supplied to the gate of the FET Q3, and the drive pulse OUT2− as an inverted signal of the PWM signal OUT2 is supplied to the gate of the FET Q4.

Figure 11:
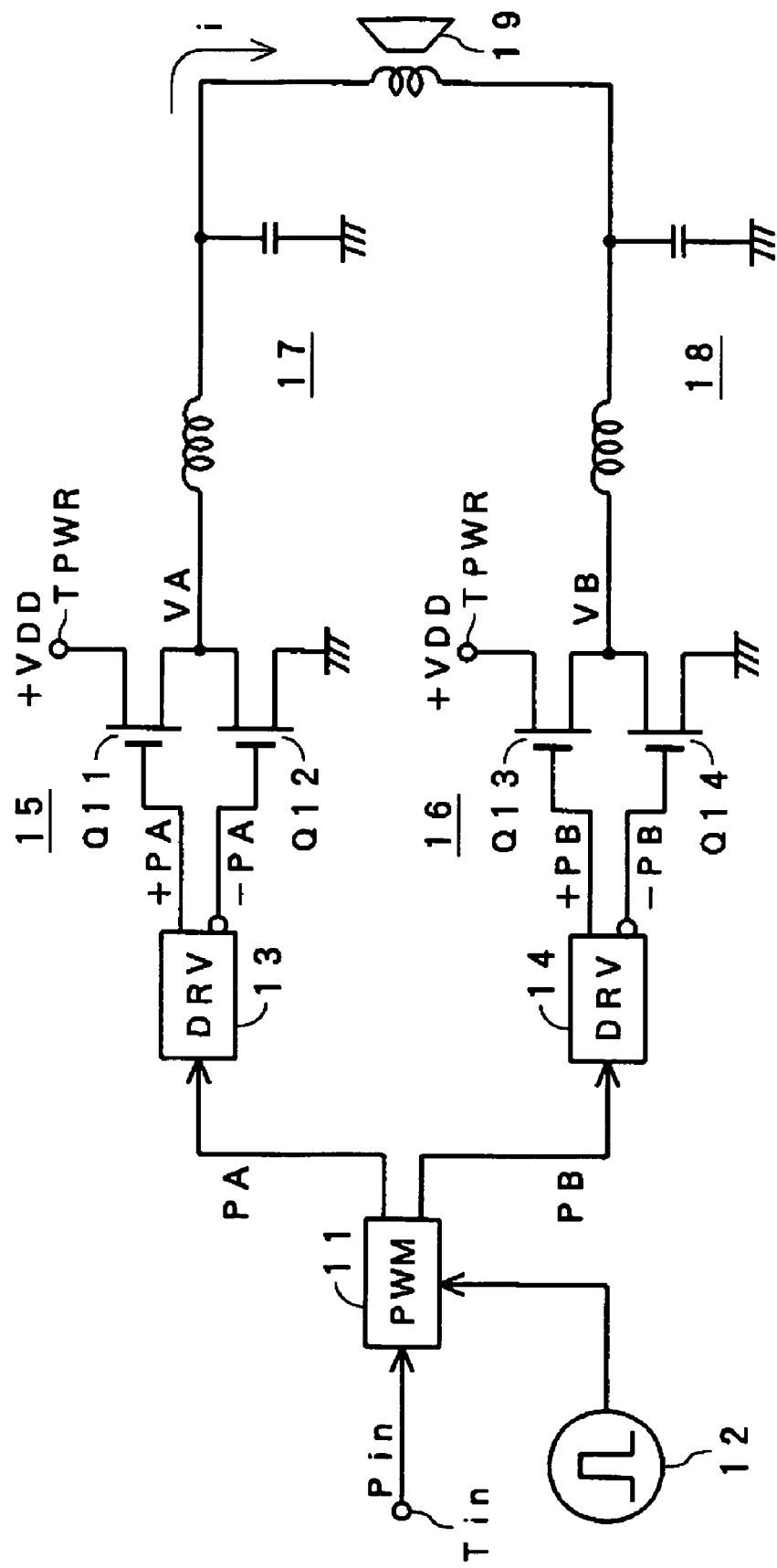
FIG. 11 illustrates an example of a configuration of a known D-class amplifier.

Accordingly, as in the D-class amplifier shown in FIG. 11, when OUT1+="H" (high), OUT1−="L" (low), the FET Q1 is turned ON, and the FET Q2 is turned OFF. At this time, a voltage VA at a node between the FETs Q1 and Q2 is +VDD. On the other hand, when OUT1+="L", OUT1−="H", the FET Q1 is turned OFF, and the FET Q2 is turned ON. At this time, the voltage VA at the node between the FETs Q1 and Q2 is 0 (zero).

Likewise, when OUT2+="H", OUT2−="L", the FET Q3 is turned ON, and the FET Q4 is turned OFF. At this time, a voltage VB at a node between the FETs Q3 and Q4 is +VDD. On the other hand, when OUT2+="L", OUT2−="H", the FET Q3 is turned OFF, the FET Q4 is turned ON. At this time, the voltage VB at the node between the FETs Q3 and Q4 is 0 (zero).

During a period when VA=+VDD and VB=0, a current i flows from the node between the FETs Q1 and Q2 through the low-pass filter 51, the speaker 6, and the low-pass filter 52, to the node between the FETs Q3 and Q4.

During a period when VA=0 and VB=+VDD, the current i flows in the opposite direction from the node between the FETs Q3 and Q4 through the low-pass filter 52, the speaker 6, and the low-pass filter 51, to the node between the FETs Q1 and Q2. During periods when VA=VB=+VDD and when VA=VB=0, the current i does not flow.

The period when the current i flows varies in accordance with a period when the PWM signals OUT1 and OUT2 are risen. Also, when the current i flows through the speaker 6, the current i is integrated by the low-pass filters 51 and 52. As a result, the current i flowing through the speaker 6 is an analog current corresponding to the level of the digital audio signal and is a power-amplified current. In other words, power-amplified output is supplied to the speaker 6.

In this embodiment, as shown in FIG. 3, a side of the FETs Q1 and Q3 to which the non-inverted drive pulses OUT1+ and OUT2+ are supplied is called a "high side" (HO), and a side of the FETs Q2 and Q4 to which the inverted drive pulses OUT1− and OUT2− are supplied is called a "low side" (LO).

In the non-feedback D-class amplifier, a full-bridge output stage configuration as shown in FIG. 3 is adopted when no coupling capacitor is provided in output of the amplifier. Herein, assume that a DC component is generated in a + (positive) polarity of the speaker 6 due to DC dither. In this case, a DC component should be generated in a − (negative) polarity in a hardware manner so as to cancel the DC component.

When a driving waveform of the switching FET is a PWM signal, a DC component can be generated to cancel a superimposed DC component due to DC dither by increasing the time when a high side (HO) input on the OUT2 side is high, by increasing the time when a low side (LO) input on the OUT1 side is low, or by combining the both.

In the non-feedback D-class amplifier according to this embodiment, the dead-time controller 41 for controlling the time when the high and low sides are turned OFF at the same time adjusts pulse widths on the high and low sides in the power switching unit 4, so as to generate a signal component for canceling the DC component.

In other words, in the D-class amplifier, the dead-time controller 41 of the power switching unit 4 creates dead time when the switching FETs on the high and low sides are turned OFF at the same time in order to prevent a large current from flowing from the power supply to the ground (GND).

Figure 4:
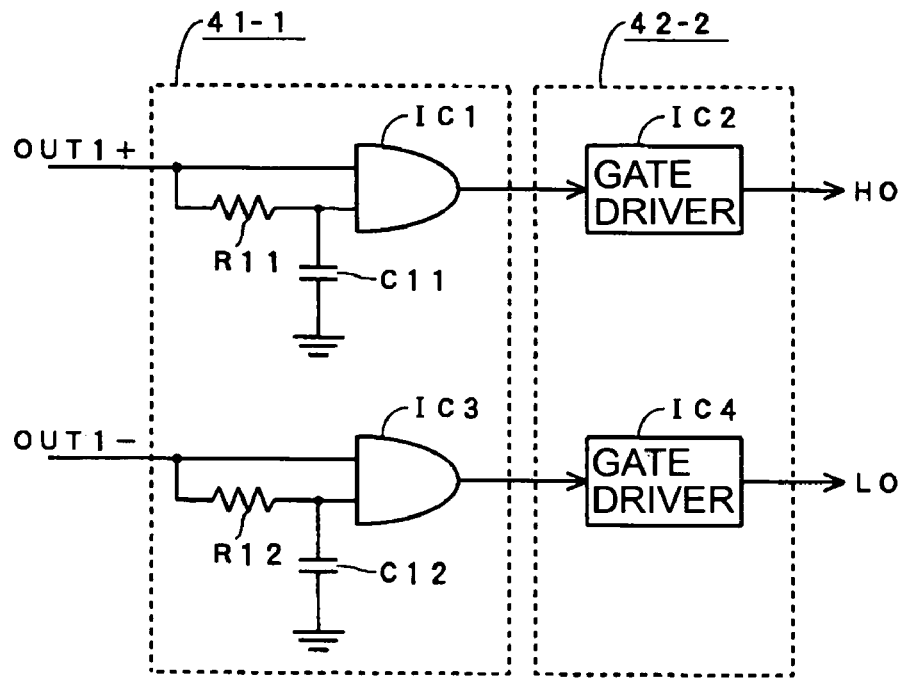
FIG. 4 illustrates an example of a configuration of a dead-time controller 41-1 of the power switching unit 4.

FIG. 4 illustrates an example of a configuration of the dead-time controller 41-1 of the power switching unit 4 of the D-class amplifier according to this embodiment. As shown in FIG. 4, the dead-time controller 41-1 includes an AND circuit IC1, a capacitor C11, and a resistor R11 on its high side, and also includes an AND circuit IC3, a capacitor C12, and a resistor R12 on its low side.

The AND circuit IC1 is supplied with the drive pulse OUT1+ and a delayed drive pulse which is generated by delaying the drive pulse OUT1+ by the capacitor C11 and the resistor R11. Likewise, the AND circuit IC3 is supplied with the drive pulse OUT1− and a delayed drive pulse which is generated by delaying the drive pulse OUT1− by the capacitor C12 and the resistor R12.

Figure 5:
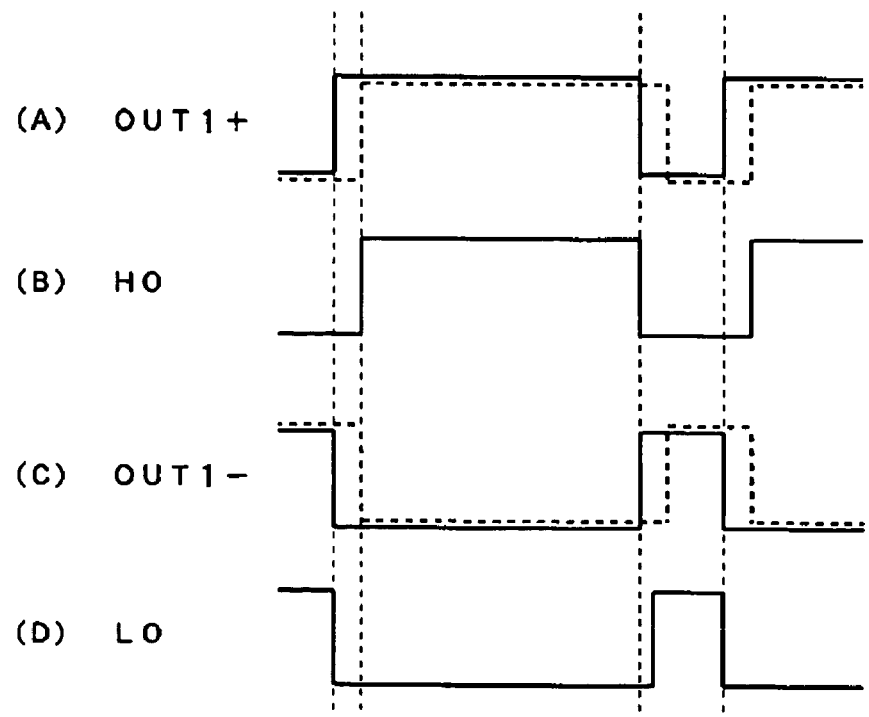
FIG. 5 illustrates a high-side signal HO and a low-side signal LO generated in the dead-time controller 41-1.

FIG. 5 illustrates a high-side signal HO and a low-side signal LO generated in the dead-time controller 41. Referring to (A) in FIG. 5, the AND circuit IC 1 shown in FIG. 4 is supplied with the drive pulse OUT1+ indicated with a solid line and the delayed drive pulse of the drive pulse OUT1+ indicated with a broken line, and an AND operation is executed in the AND circuit IC1. As a result, a high-side signal HO having a shorter high-level period and a longer low-level period than those of the drive pulse OUT1+ is generated as shown in (B) in FIG. 5.

On the other hand, referring to (C) in FIG. 5, the AND circuit IC 3 shown in FIG. 4 is supplied with the drive pulse OUT1− indicated with a solid line and the delayed drive pulse of the drive pulse OUT1− indicated with a broken line, and an AND operation is executed in the AND circuit IC3. As a result, a low-side signal LO having a longer low-level period and a shorter high-level period than those of the drive pulse OUT1− is generated as shown in (D) in FIG. 5.

The high-side signal HO generated in this manner is supplied to the gate of the FET Q1 on the high side of the switching circuit unit 43 through a gate driver IC2, and the low-side signal LO is supplied to the gate of the FET Q2 on the low side of the switching circuit unit 43 through a gate driver IC4. Accordingly, a DC component due to DC dither generated at the positive polarity of the speaker 6 can be removed.

Note that, a DC component is not generated if the drive pulses OUT1+ and OUT1− are delayed by the same amount on the high and low sides in the dead-time controller 41-1 shown in FIG. 4. The DC component can be generated if the drive pulses OUT1+ and OUT1− are delayed by different amounts on the high and low sides.

In order to vary the delay time, a constant of the capacitors C11 and C12 or the resistors R11 and R12 should be changed. By generating the delay time so that the superimposed DC component due to DC dither is canceled, the DC component in output of the speaker can be removed. The DC dither has a fixed value. Therefore, the amount of delay of the drive pulses for generating a DC component of an opposite polarity to the DC component to remove the DC component generated due to DC dither superimposing on an input signal can be obtained in advance.

The configuration of the dead-time controller 41-1 shown in FIG. 4 is only an example, and another configuration can be of course adopted as long as the pulse widths of the drive pulse supplied to the high-side FET and the drive pulse supplied to the low-side FET can be changed. Accordingly, a DC component in output of the speaker can be canceled.

Figure 6:
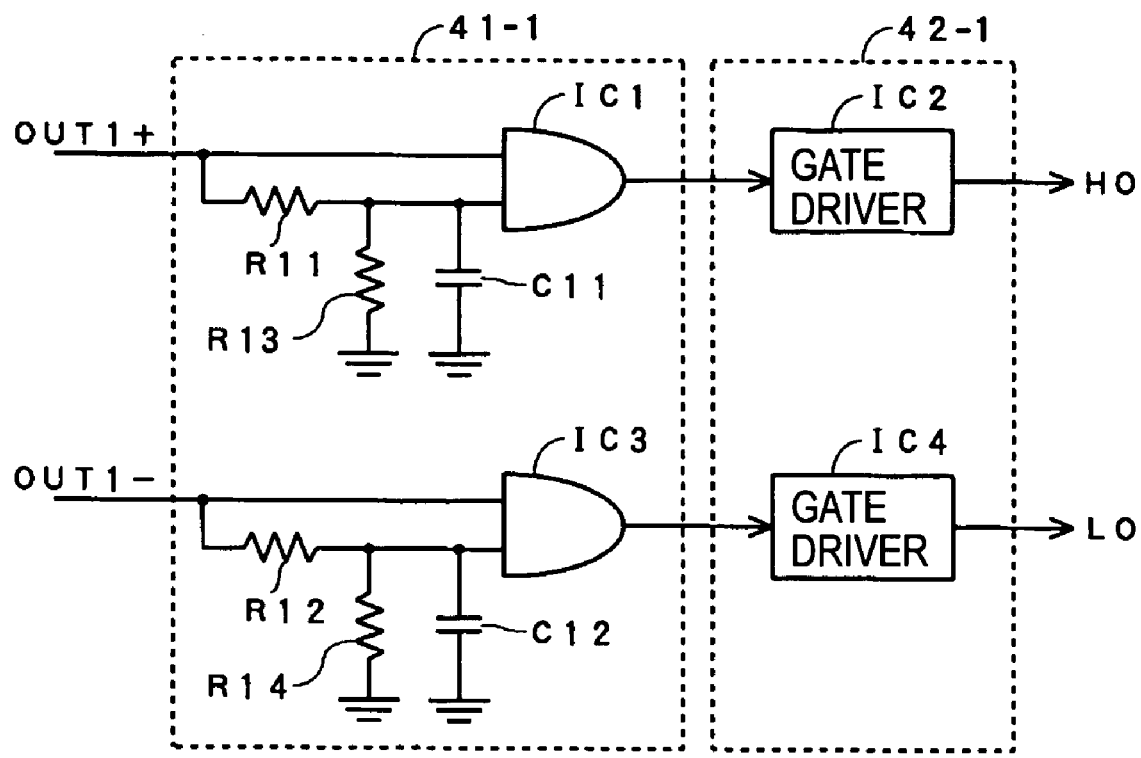
FIG. 6 illustrates another example of the configuration of the dead-time controller 41-1.

For example, as shown in FIG. 6, a resistor R13 may be provided between the capacitor C11 and the resistor R11, and a resistor R14 may be provided between the capacitor C12 and the resistor R12. In this way, the pulse widths can be changed by changing the constant of the resistors R13 and R14.

Herein, a case where a DC component due to DC dither is generated at the + (positive) polarity of the speaker is described. However, the above-described process can be applied to a case where a DC component due to DC dither is generated at the − (negative) polarity of the speaker. That is, a DC component can be generated to cancel a superimposed DC component due to DC dither by increasing the time when the high side (HO) input on the OUT1 side is high, by increasing the time when the low side (LO) input on the OUT2 side is low, or by combining the both.

Herein, as shown in FIGS. 4 and 6, the high and low sides have the same configuration. Alternatively, only one of the high and low sides may be provided with an AND circuit, a capacitor, and a resistor so that the pulse width of the drive pulse on one of the high and low sides is adjusted. However, the pulse width of the drive pulse should be adjusted on both high and low sides in order to improve distortion of an audio signal.

<Another Example of Generating a DC Component to Remove a DC Component Due to DC Dither>

In the above description, a signal for canceling a DC component due to DC dither is generated in the dead-time controller 41. Alternatively, a DC component to cancel DC dither can be generated by adjusting pulse widths by varying a threshold Vth for distinguishing ON/OFF of a drive pulse on the high and low sides in the power switching unit 4.

Figure 7:
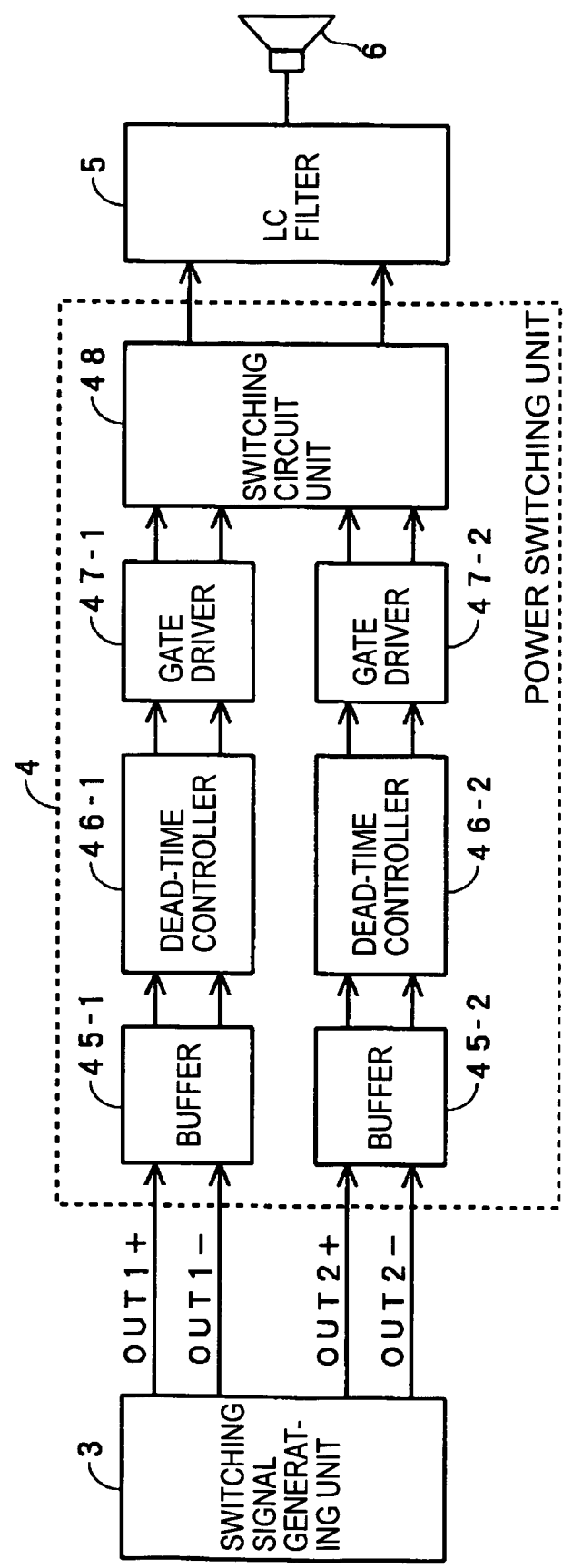
FIG. 7 is a block diagram illustrating another example of the power switching unit 4 shown in FIG. 1.

In that case, as shown in FIG. 7, buffers 45-1 and 45-2 are provided in the power switching unit 4. Other than this, dead-time controllers 46-1 and 46-2, gate drivers 47-1 and 47-2, and a switching circuit unit 48 have the same configuration and function as those of the dead-time controllers 41-1 and 41-2, the gate drivers 42-1 and 42-2, and the switching circuit unit 43 shown in FIG. 2, respectively.

Note that, the function of the dead-time controllers 46-1 and 46-2 is partly different from that of the dead-time controllers 41-1 and 41-2 shown in FIG. 2. That is, the dead-time controllers 46-1 and 46-2 control the time when the high and low sides are turned OFF at the same time, but do not have a function of generating a signal component to cancel a DC component.

Referring to FIG. 7, when the drive pulses OUT1+ and OUT1−, which are supplied from the switching signal generating unit 3, are temporarily stored in the buffer 45-1 in the power switching unit 4 and are then read therefrom, a threshold for distinguishing ON/OFF is varied in the drive pulses OUT1+ and OUT1−.

Figure 8:
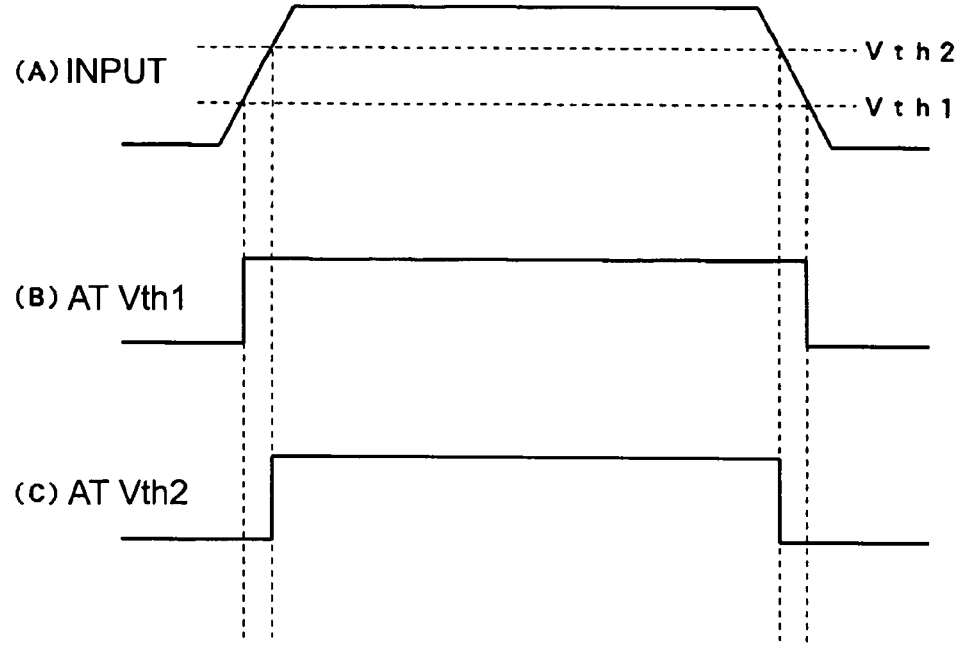
FIG. 8 illustrates a method for changing a pulse width.

FIG. 8 illustrates a method for changing pulse widths of the drive pulses OUT1+ and OUT1− by varying a threshold for distinguishing ON/OFF of the drive pulses OUT1+ and OUT1−. As shown in (A) in FIG. 8, rising and falling edges of the drive pulses OUT1+ and OUT1− are slightly inclined. In other words, each of the rise time and fall time is not zero seconds, and the waveform changes for some time.

Therefore, as thresholds Vth1 and Vth2 on the left of (A) in FIG. 8 indicate, the pulse widths of the drive pulses OUT1+ and OUT1− can be changed by changing the threshold Vth for distinguishing ON/OFF of the drive pulses OUT1+ and OUT1− as an input signal.

More specifically, when ON/OFF of an input signal is determined by using a relatively small threshold Vth1 shown in (A) in FIG. 8, the pulse width can be widened as shown in (B) in FIG. 8. On the other hand, when ON/OFF is determined by using the threshold Vth2 larger than the threshold Vth1, ON/OFF of an input signal is determined with reference to the threshold Vth2 higher than the threshold Vth1, and thus the pulse width of the signal can be made narrower than a case where the threshold Vth1 is used, as shown in (C) in FIG. 8.

Figure 9:
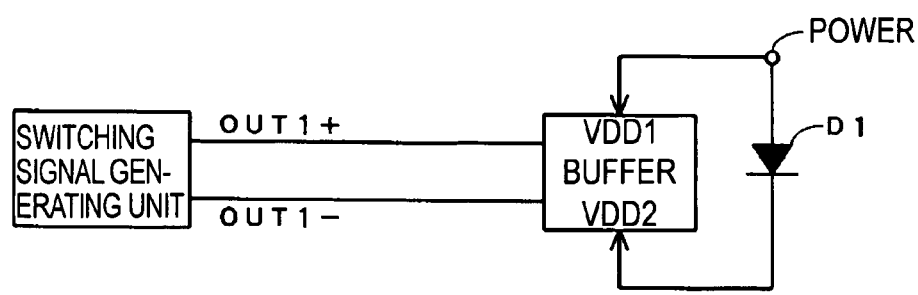
FIG. 9 illustrates a specific example of the method for changing the pulse width.

Actually, as shown in FIG. 9, the power supply is used as the threshold. In this state, the power supply as the threshold is directly supplied when the drive pulse OUT1+ is read, and the power supply as the threshold is supplied through a diode D1 when the drive pulse OUT1− is read. Accordingly, the pulse widths of the drive pulses OUT1+ and OUT1− can be varied.

In this case, too, assume that a DC component is generated at the + (positive) polarity of the speaker 6 shown in FIG. 3 due DC dither. In this case, the DC component can be canceled by generating a DC component at the − (negative) polarity in a hardware manner. If the driving waveform of the switching FET is a PWM signal, a DC component can be generated to cancel the superimposed DC component due to DC dither by increasing the time when the high side (HO) input on the OUT2 side is high, by increasing the time when the low side (LO) input on the OUT1 side is low, or by combining the both.

In this way, by varying the threshold Vth for distinguishing ON/OFF of the high side (OUT1+) and the low side (OUT1−) in the buffer 45 of the power switching unit 4, the pulse widths can be adjusted and a DC component for canceling a DC component caused by DC dither can be generated.

The pulse width does not change even by changing the threshold Vth if the rise time and fall time of the drive pulse is zero seconds. Actually, however, the rise time and fall time are not zero seconds, that is, the rising and falling edges incline. Therefore, the pulse width can be adjusted by changing the threshold Vth. In order to adjust the threshold Vth, an original wave height is changed by changing a power supply voltage as shown in FIG. 9, so that the substantial threshold Vth is changed.

In this case, too, the pulse width of only one of the drive pulses on the high and low sides may be adjusted, or the pulse widths of both of the drive pulses on the high and low sides may be adjusted.

<Others>

In the above-described embodiment, the present invention is applied to a non-feedback digital D-class amplifier, but the present invention is not limited to this type of amplifier. For example, the present invention can be applied to a feedback digital D-class amplifier shown in FIG. 10.

Figure 10:
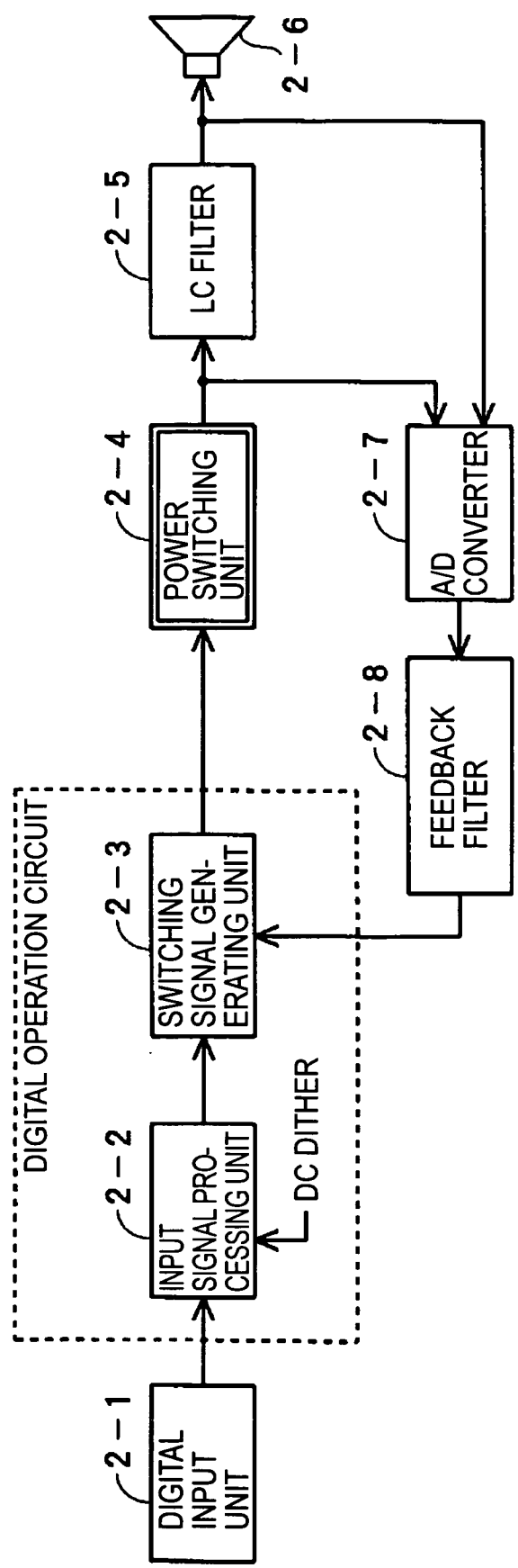
FIG. 10 is a block diagram illustrating an example of a configuration of a D-class amplifier to which the present invention can be applied.

That is, the feedback digital D-class amplifier shown in FIG. 10 includes a digital input unit 2-1, an input signal processing unit 2-2, a switching signal generating unit 2-3, a power switching unit 2-4, an LC filter 2-5, an A/D converter 2-7, and a feedback filter 2-8.

As shown in FIG. 10, in the feedback digital D-class amplifier, DC dither is added in the input signal processing unit 2-2. In this case, as in the non-feedback D-class amplifier shown in FIG. 1, a signal for removing a DC component caused by the DC dither is generated in the power switching unit 2-4, so that the DC component due to the DC dither contained in the audio signal can be removed.

In the above-described embodiment, the switching circuit unit 43 or 48 has a full-bridge configuration using two pairs of switching devices as shown in FIG. 3, but the present invention is not limited to this configuration. For example, the present invention can be applied to a power amplifier apparatus which has a half-bridge configuration using a pair of switching devices and which does not use a coupling capacitor.

In the above-described embodiment, the present invention is applied to a so-called D-class amplifier receiving input of digital audio signals, but the present invention is not limited to this. For example, the present invention can be applied to a case of receiving analog audio signals and converting them to digital signals by delta-sigma modulation. That is, the present invention can be applied to a digital D-class amplifier receiving analog audio signals.

It should be understood by those skilled in the art that various modifications, combinations, sub-combinations and alterations may occur depending on design requirements and other factors insofar as they are within the scope of the appended claims or the equivalents thereof.

What is claimed is:

1. A power amplifier apparatus comprising:
dither superimposing means for superimposing DC dither on a digital signal;
switching signal generating means for converting the digital signal on which the DC dither is superimposed by the dither superimposing means to a pair of drive pulses on high and low sides having opposite levels; and
cancel signal generating means for generating a cancel signal to cancel a DC component caused by the DC dither by changing a ratio of pulse widths of the drive pulses on the high and low sides generated by the switching signal generating means,
wherein the cancel signal generating means includes delay means for delaying at least one of the pair of drive pulses on the high and low sides by a predetermined amount, and
changes the ratio of the pulse widths of the pair of drive pulses by performing a logical operation of a delayed drive pulse generated by the delay means and the drive pulse which is not delayed.

2. A power amplifier apparatus comprising:
dither superimposing means for superimposing DC dither on a digital signal;
switching signal generating means for converting the digital signal on which the DC dither is superimposed by the dither superimposing means to a pair of drive pulses on high and low sides having opposite levels; and
cancel signal generating means for generating a cancel signal to cancel a DC component caused by the DC dither by changing a ratio of pulse widths of the drive pulses on the high and low sides generated by the switching signal generating means,
wherein the cancel signal generating means includes threshold adjusting means for adjusting a threshold for switching the pair of drive pulses on the high and low sides generated by the switching signal generating means, and
changes the ratio of the pulse widths of the drive pulses by using the threshold adjusting means.

3. A DC component removing method comprising the steps of:
superimposing DC dither on a digital signal;
generating a switching signal by converting the digital signal on which the DC dither is superimposed in the dither superimposing step to a pair of drive pulses on high and low sides having opposite levels; and
generating a cancel signal to cancel a DC component caused by the DC dither by changing a ratio of pulse widths of the drive pulses on the high and low sides generated in the switching signal generating step,
wherein, in the cancel signal generating step,
at least one of the pair of drive pulses on the high and low sides is delayed by a predetermined amount, and
the ratio of the pulse widths of the pair of drive pulses is changed by performing a logical operation of a delayed drive pulse and the pair of drive pulse which is not delayed.

4. A DC component removing method comprising the steps of:
superimposing DC dither on a digital signal;
generating a switching signal by converting the digital signal on which the DC dither is superimposed in the dither superimposing step to a pair of drive pulses on high and low sides having opposite levels; and
generating a cancel signal to cancel a DC component caused by the DC dither by changing a ratio of pulse widths of the drive pulses on the high and low sides generated in the switching signal generating step,
wherein the cancel signal generating step includes:
adjusting a threshold for switching the pair of drive pulses on the high and low sides generated in the switching signal generating step, and
the ratio of the pulse widths of the pair of drive pulses is changed in the threshold adjusting step.

5. A power amplifier apparatus comprising:
a dither superimposer configured to superimpose DC dither on a digital signal;
a switching signal generator configured to convert the digital signal on which the DC dither is superimposed by the dither superimposer to a pair of drive pulses on high and low sides having opposite levels; and
a cancel signal generator configured to generate a cancel signal to cancel a DC component caused by the DC dither by changing a ratio of pulse widths of the drive pulses on the high and low sides generated by the switching signal generator,
wherein the cancel signal generator includes a delay circuit configured to delay at least one of the pair of drive pulses on the high and low sides by a predetermined amount, and changes the ratio of the pulse widths of the pair of drive pulses by performing a logical operation of a delayed drive pulse generated by the delay circuit and the drive pulse which is not delayed.

6. A power amplifier apparatus comprising:
a dither superimposer configured to superimpose DC dither on a digital signal;
a switching signal generator configured to convert the digital signal on which the DC dither is superimposed by the dither superimposer to a pair of drive pulses on high and low sides having opposite levels; and
a cancel signal generator configured to generate a cancel signal to cancel a DC component caused by the DC dither by changing a ratio of pulse widths of the drive pulses on the high and low sides generated by the switching signal generator,
wherein the cancel signal generator includes threshold adjustor configured to adjust a threshold for switching the pair of drive pulses on the high and low sides generated by the switching signal generator, and changes the ratio of the pulse widths of the drive pulses by using the threshold adjustor.

* * * * *